United States Patent [19]

Nanigian

[11] Patent Number: 4,732,619

[45] Date of Patent: Mar. 22, 1988

[54] SELF RENEWING THERMOCOUPLE

[75] Inventor: Jacob Nanigian, Lake Worth, Fla.

[73] Assignee: Nanmac Corporation, Lake Worth, Fla.

[21] Appl. No.: 1,452

[22] Filed: Jan. 8, 1987

[51] Int. Cl.⁴ ............................................. H01V 1/02
[52] U.S. Cl. ...................................... 136/228; 136/237; 29/595
[58] Field of Search ............................... 136/228–237; 29/857, 595, 592 R

[56] References Cited

U.S. PATENT DOCUMENTS

| | | | |
|---|---|---|---|
| 2,698,352 | 12/1954 | Fagg et al. | 136/228 |
| 2,810,005 | 10/1957 | Ray | 136/228 |
| 2,829,185 | 4/1958 | Macatician et al. | 136/4 |
| 2,941,192 | 6/1960 | Postal | 340/228 |
| 3,116,168 | 12/1963 | Gee | 136/4 |
| 3,449,174 | 6/1969 | Kleinle | 136/228 |
| 3,542,604 | 11/1970 | Arrance et al. | 136/205 |
| 3,707,429 | 12/1972 | Saunders | 161/116 |
| 3,865,632 | 2/1975 | Elsner et al. | 136/237 |
| 3,973,997 | 8/1976 | Solomon | 136/228 |

Primary Examiner—Barry S. Richman
Assistant Examiner—T. J. Wallen
Attorney, Agent, or Firm—Laurence R. Brown

[57] ABSTRACT

A renewable, elongated thermocouple probe having a first elongated thermocouple element and a second elongated thermocouple element surrounding the first element. Electrical insulation material is positioned between opposed surfaces of the first and second thermocouple elements to electrically insulate the elements from each other. A temperature sensing tip is provided at one end of the probe by grinding the end of the probe with an abrasive material to provide an electrically conductive connection in the form of metallic particles to define a conduction path between the first and second thermocouple elements and over the insulating material. The opposite end of the probe can be connected with a thermocouple reference junction in a conventional manner.

24 Claims, 4 Drawing Figures

SELF RENEWING THERMOCOUPLE

BACKGROUND OF THE INVENTION

1. Field of the Invention

This invention relates to thermocouples, and more particularly to a renewable thermocouple that can provide a continuous measuring tip upon erosion of the measuring tip end of the thermocouple.

2. Description of the Prior Art

Thermocouples utilize the principles of thermoelectricity by providing a circuit that includes two dissimilar metallic conductors joined together at one end to define a first, or hot junction, and a second, or cold junction. The temperature difference between the respective ends of the thermocouple will cause a current to flow in the circuit. In the past, the hot junction, or the measuring tip end of the thermocouple, was a mechanical joint of the two dissimilar metals. Consequently, if the joint was eroded away, the erosion would destroy the measuring tip, thereby requiring that the thermocouple be replaced with another. However, such repeated replacement is expensive where the measuring tip is exposed to continuous or intermittent erosive forces.

In U.S. Pat. No. 2,829,185, which issued Apr. 1, 1958, to J. Macatician et al., there is disclosed a thermocouple structure for use in a gun barrel for sensing the temperature of the interior surface of the bore of the barrel. The measuring tip of the thermocouple disclosed in that patent includes two dissimilar metals that are separated from each other by an insulating material. One of the thermocouple elements is a flat ribbon of nickel wire, and surrounding the nickel wire is mica insulation, against the outer surfaces of which the second thermocouple element is securely attached. An electrical connection between the dissimilar metals at the measuring tip is effected by grinding the measuring tip end of the thermocouple to provide metal particles that bridge across the surface of the intervening insulation to provide an electrical connection between the two dissimilar metals. However, the structure disclosed in that patent has several disadvantages in that it requires a flattened wire as one of the thermocouple elements, and the application of mica sheet insulation to the exterior surface of the flattened wire is a time consuming process. Further, the second thermocouple element is defined by a thick, machined, two-part thermocouple element that is both costly to produce and time consuming to assemble.

It is therefore an object of the present invention to provide an improved thermocouple structure in which the measuring tip of the thermocouple is self renewable in order to avoid the need for repeated replacement of thermocouple elements, and which structure involves minimum manual assembly procedures, is suitable for mass production, has a longer overall length to provide a continuous measuring tip as the thermocouple measuring tip structure is eroded in use, and can be made in a small size.

SUMMARY OF THE INVENTION

Briefly stated, in accordance with one aspect of the present invention, a renewable, elongated thermocouple probe is provided that includes a first elongated thermocouple element formed from a first metallic thermocouple material and having a substantial length relative to its width, and a second elongated thermocouple element formed from a second metallic thermocouple material different from the first material and surrounding the first thermocouple element, the second thermocouple element also having a substantial length relative to its width. Electrical insulation is positioned between opposite surfaces of the first and second thermocouple elements to electrically insulate the thermocouple elements from each other. The thermocouple elements each have a first and second end, and each of the first ends are electrically connected to a thermocouple reference junction. Similarily, each of the second ends and the insulation have end faces that lie in and define a continuous end surface of the thermocouple. A connection arrangement is provided extending between each of the second ends and bridging the insulation to define a temperature sensing tip, the tip being erodible while maintaining continuous temperature sensing capability as the probe overall length diminishes as a result of the erosion.

In accordance with another aspect of the present invention, a method of making a renewable thermocouple probe is provided, the method including providing a first elongated thermocouple element formed from a first metallic thermocouple material and having a substantial length relative to its width, the first elongated thermocouple element having a longitudinally extending surface, covering the longitudinal external surface with electrical insulation material, and surrounding the insulation material with a second elongated thermocouple element formed from a second metallic thermocouple material different from the first material. A temperature sensing tip is formed at one end of the probe by passing an abrasive member across the end of the probe to cause metallic particles from at least one of the first and second thermocouple elements to define an electrical connection between the elements.

DESCRIPTION OF THE PREFERRED EMBODIMENTS

Figure 1:
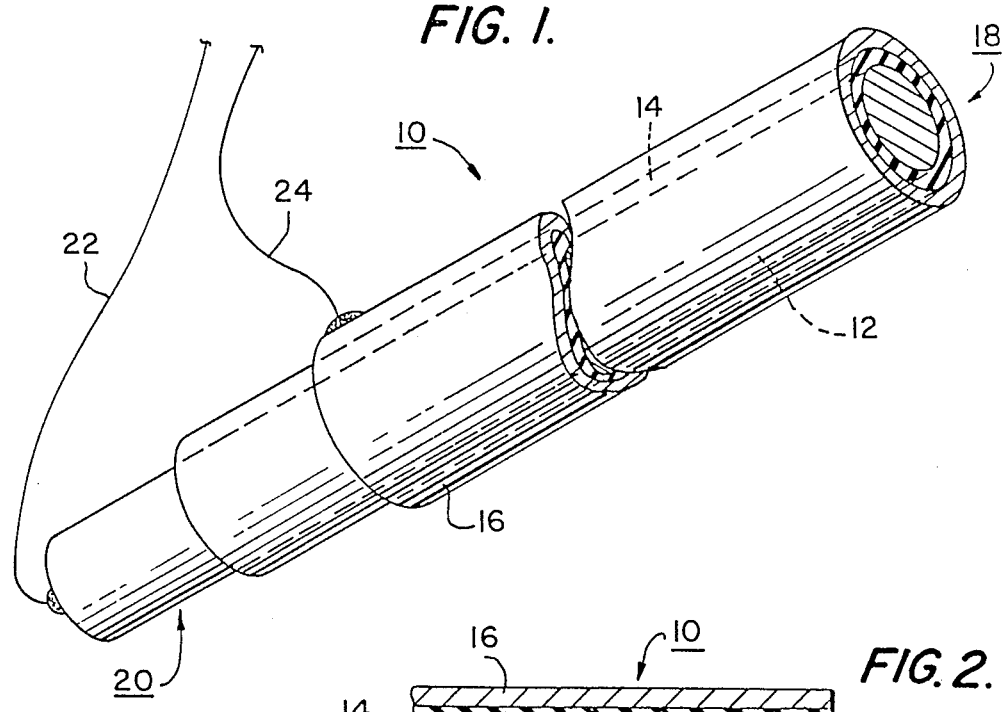
FIG. 1 is a fragmentary perspective view, partially broken away, illustrating an improved renewable thermocouple in accordance with the present invention.
Figure 2:
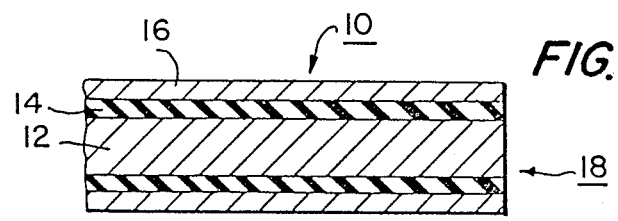
FIG. 2 is a fragmentary longitudinal cross-sectional view of the thermocouple structure shown in FIG. 1.

Referring now to the drawings, and particularly to FIGS. 1 and 2, there is shown a thermocouple probe 10 including a first, elongated thermocouple element 12 formed from a first metallic thermocouple material and having a substantial length relative to its width. As shown, first thermocouple element 12 is a cylindrical structure, which can be in the form of a wire, or the like. Surrounding first thermocouple element 12 is a layer 14 of insulation material having a high dielectric strength, and can be a fluorocarbon material, commercially known by the trademark TEFLON, and which is manufactured by E. I. du Pont de Nemours and Company, Wilmington, Del. The insulating material is continuous over the outer surface of first thermocouple element 12.

Surrounding insulation material 14 is a second elongated thermocouple element 16, formed from a second metallic thermocouple material that is different from the metallic material from which first thermocouple element 12 is formed. Second thermocouple element 16 is in the form of a tubular member that fits tightly over insulating material 14, and is therefore completely electrically insulated from first thermocouple element 12. The resultant thermocouple probe has a constant cross-sectional area along its length.

One end of the thermocouple probe is a measuring tip 18, and the opposite end 20 includes a pair of wires 22, 24 connected to respective ones of first and second thermocouple elements 12,14, wires 22 and 24 being connected with a reference junction (not shown) in the conventional manner. Because such a reference junction and related structure are well known to those skilled in the art, no further description of that structure is provided herein.

Measuring tip 18 of the thermocouple is formed by passing a grinding or polishing surface, such as a grinding or a polishing wheel, across the measuring tip of thermocouple probe 10 to abade tip 18 and thereby provide small metal particles in the form of metallic splinters or whiskers that bridge insulation layer 14 and define a conduction path thereacross to interconnect each of the first and second thermocouple elements and thereby create the measuring junction. The surface measuring tip 18 can be curved or it can be planar, and it can be perpendicular to the probe longitudinal axis as shown in FIG. 2 or inclined thereto.

An example of one form of thermocouple probe in accordance with the present invention includes a first thermocouple element in the form of a length of constantan wire, gauge No. 10 and having a diameter of 0.1019 inches. A thin layer of Teflon is applied to the outer surface of the constantan wire to provide an insulating layer having a thickness of about 0.0005 inches, or less. The insulation-covered constantan wire is inserted into a copper tube having substantially the same length as the wire. The copper tube can have an outside diameter of about 0.156 inches, and a wall thickness of about 0.015 inches. The tube and the interiorly-positioned wire are fed through an automatic swaging or drawing machine, which will compress the copper tube and reduce its outer diameter to about 0.125 inches. That process will tightly compact the copper tube over the Teflon insulated constantan wire to provide a thermocouple probe that has a constant cross-sectional area along its length. The swaged assembly can then be cut to the desired length with a cutting wheel or a hack saw, and the measuring tip end of the thermocouple probe is squared off in a lathe, and is ground by means of a grinding wheel, a belt sander, or the like.

The opposite end of the probe, from which the wires extended for connection to the reference junction, has a portion of the Teflon insulation material removed from the outer surface of the first, inner thermocouple element, and a portion of the outer copper tube is also removed, the length of copper tube removed being greater than the length of Teflon insulation removed. Lead wires are secured to the respective thermocouple elements by means of soldering, brazing, or the like. For best results, a copper wire should be attached to the copper outer tube, and a constantan lead wire should be attached to the inner constantan core. The abrasive utilized for forming the connecting junction across the insulation at the measuring tip can be provided by a No. 80 to a No. 120 grit size abrasive sandpaper.

In use, as the measuring tip of the thermocouple probe wears away by abrasive action, the resulting erosion process that causes the wear will automatically and continuously make new metallic junctions to extend across the insulating material, even as the probe is being shortened. Further, because the present thermocouple probe has a constant cross-sectional area, it can readily be advanced in its axial direction as erosive wear occurs to maintain the measuring tip in a desired position for temperature measurement purposes. Thus, the present thermocouple probe is self-renewable, provides a continuous measuring tip as wear occurs, and has a life that is limited only by the overall length of the probe structure.

Although disclosed above in terms of a copper-constantan type structure, other materials can also be utilized to provide the respective thermocouple elements, and examples of such materials are given below in Table I.

TABLE I

THERMOCOUPLE TYPES

| Type | Thermocouple Element | Thermocouple Wire Materials** |
|---|---|---|
| T | TP | Copper |
|   | TN | Constantan (Advance*, Cupron*) |
| J | JP | Iron |
|   | JN | Constantan (Advance*, Cupron*) |
| E | EP | Chromel*, Tophel*, T-1* |
|   | EN | Constantan (Advance*, Cupron*) |
| K | KP | Chromel*, Tophel*, T-1* |
|   | KN | Alumel*, Nial*, T-2* |
| R | RP | Platinum - 13% rhodium |
|   | RN | Platinum |
| S | SP | Platinum - 10% rhodium |
|   | SN | Platinum |
| B | BP | Platinum - 30% rhodium |
|   | BN | Platinum - 6% rhodium |

*Trademark or trade name.

If desired, an insulating material other than Teflon can be used. For example, coatings of polyvinyl chloride, nylon, fiberglass, mica, ceramic oxides, cements, and the like, can also be used. The principal requirement for the insulation material is that it be usable over the expected temperature range of the thermocouple without degradation, and it must completely cover the outside periphery of the inner thermocouple element in the area that is surrounded by the outer thermocouple element.

Figure 3:
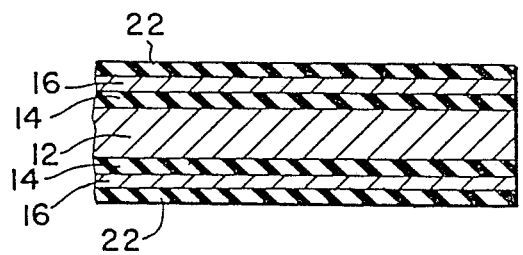
FIG. 3 is a fragmentary longitudinal cross-sectional view of another embodiment of a thermocouple in accordance with the present invention, wherein the outermost thermocouple element is surrounded by electrical insulation material.

Another embodiment of the present invention is illustrated in cross section in FIG. 3, wherein the thermocouple probe structure 20 is similar to that of the embodiment illustrated in FIGS. 1 and 2, except that the FIG. 3 embodiment includes an outer insulation layer 22 that overlies and covers tubular second thermocouple element 16. Such a structure can be used in applications where the thermocouple probe must not be electrically grounded. Again, suitable insulating materials to provide the outer insulation covering are the same as those that are disclosed above in connection with the interior insulation layer.

Figure 4:
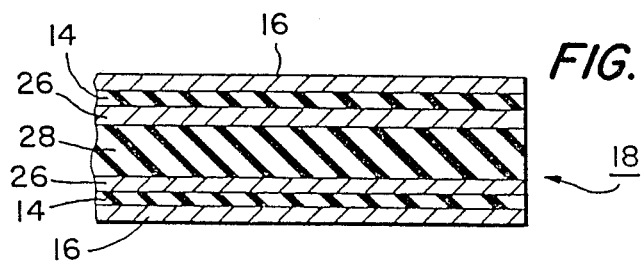
FIG. 4 is a fragmentary longitudinal cross-sectional view of a further embodiment of a thermocouple in accordance with the present invention, wherein the innermost thermocouple element is a tubular member and includes internal insulation material therewithin.

A further embodiment of the present invention is illustrated in cross section in FIG. 4, wherein the thermocouple probe 24 includes a first, or inner thermocouple element 26 that is provided in the form of a tube or hollow cylinder, which can have a wall thickness of about 0.005 inches. Such a structure can be advantageous where the amount of metal that is exposed to a hot environment must be minimized. Additionally, it can also be utilized in applications where the amount of metal required for the inner element of the probe must be minimized in order to reduce the cost of the structure, particularly where costly metals, such as platinum, are involved. As further illustrated in FIG. 4, where inner thermocouple element 26 is an inner tubular stucture, the space within the tube can, if desired, be filled with electrical insulation material 28, which can be, for example, an epoxy or a ceramic material suitable for use at high temperatures.

It can thus be seen that the present invention provides distinct advantages over the prior art structures in terms of a renewable thermocouple probe that has a long service life and that is relatively inexpensive to produce.

Although particular embodiments of the present invention have been illustrated and described, it will be apparent to those skilled in the art that various changes and modifications can be made without departing from the spirit of the present invention. It is therefore intended to encompass within the appended claims all such changes and modifications that fall within the scope of the present invention.

What is claimed is:

1. A renewable, elongated thermocouple probe comprising:
   (a) a first elongated thermocouple element having a length dimension extending along a longitudinal axis and having a width dimension extending transverse to the longitudinal axis, the first thermocouple element formed from a first metallic thermocouple material and having a length substantially greater than its width;
   (b) a second elongated thermocouple element having a length dimension extending along a longitudinal axis and having a width dimension extending transverse to the longitudinal axis, the second thermocouple element formed from a second metallic thermocouple material different from said first material and surrounding said first thermocouple element to define a thermocouple probe, said second thermocouple element having a length substantially greater than its width;
   (c) electrical insulation means positioned between opposed surfaces of said first and second thermocouple elements to electrically insulate said thermocouple elements from each other;
   (d) said thermocouple elements each having spaced first and second longitudinal ends, each of said first ends electrically connected to a thermocouple reference junction, and each of said second ends and said insulation means having end faces that lie in and define an end surface of the thermocouple probe; and
   (e) connection means extending between each of said second ends and bridging said insulation means to define a temperature sensing tip, the tip being abrasively erodable while maintaining continuous temperature sensing capability as the length of the probe diminishes.

2. A thermocouple probe in accordance with claim 1, wherein said first thermocouple material is a metallic material having a major component selected from the group consisting of copper, iron, and chromel, and said second thermocouple material is a metallic material having constantan as a major component thereof.

3. A thermocouple probe in accordance with claim 1, wherein said first thermocouple material is a metallic material having chromel as a major component thereof, and said second thermocouple material is a metallic material having a major component selected from the group consisting of constantan and alumel.

4. A thermocouple probe in accordance with claim 1, wherein said first thermocouple material is a metallic material having a major component of platinum, and a minor component of rhodium, and said second thermocouple material is a metallic material that includes platinum.

5. A thermocouple probe in accordance with claim 4, wherein said second thermocouple material has a major component of platinum and a minor component of rhodium.

6. A thermocouple probe in accordance with claim 1, wherein said electrical insulation means is a material selected from the group consisting of fluorocarbon polymers, polyvinyl chloride, nylon, fiberglass, mica, and ceramic oxide.

7. A thermocouple probe in accordance with claim 6, wherein said insulating material has a maximum thickness of about 0.0005 inches.

8. A thermocouple probe in accordance with claim 1, wherein said second thermocouple element includes an electrical insulation material on an outer surface thereof, the electrical insulation material extending between the first and second ends of the thermocouple element.

9. A thermocouple probe in accordance with claim 1, wherein said first ends of said first and second thermocouple elements are spaced from each other along a longitudinal axis of the thermocouple probe, and said insulating means terminates between said spaced first ends.

10. A thermocouple probe in accordance with claim 1, wherein said end surface is substantially planar.

11. A thermocouple probe in accordance with claim 10, wherein said continuous end surface is substantially perpendicular to a longitudinal axis of the thermocouple probe.

12. A thermocouple probe in accordance with claim 1, wherein said connecting means are defined by metallic particles that provide a conduction path between said first and second thermocouple elements and over said insulation means.

13. A thermocouple probe in accordance with claim 1, wherein said first thermocouple element is a solid cylindrical conductor, and said second thermocouple element is a tubular conductor.

14. A thermocouple probe in accordance with claim 13, wherein said first thermocouple element includes a hollow interior volume that carries an electrical insulation material.

15. A thermocouple probe in accordance with claim 1, wherein said first thermocouple element is a tubular conductor, and said second thermocouple element is a tubular conductor having a cross-sectional shape corresponding with that of the first element.

16. A renewable, elongated thermocouple probe comprising:
   (a) a first elongated thermocouple element having a length dimension extending along a longitudinal axis and having a width dimension extending transverse to the longitudinal axis, the first thermocouple element formed from copper and having a length substantially greater than its width;

(b) a second elongated thermocouple element having a length dimension extending along a longitudinal axis and having a width dimension extending transverse to the longitudinal axis, the second thermocouple element formed from constantan and surrounding said first thermocouple element to define a thermocouple probe, said second thermocouple element having a length substantially greater than its width;

(c) fluorocarbon insulating material positioned between opposed surfaces of said first and second thermocouple elements to electrically insulate said thermocouple elements from each other;

(d) said thermocouple elements each having spaced first and second longitudinal ends, each of said first ends electrically connected to a thermocouple reference junction, and each of said second ends and said insulation means having end faces that are flat and are substantially co-planar; and (e) connection means defined by metallic particles that provide a conduction path between said first and second thermocouple elements and over said insulation means at each of said second ends to define a temperature sensing tip, the tip being erodable while maintaining continuous temperature sensing capability as the length of the probe length diminishes.

17. A method of making a renewable thermocouple probe, said method comprising:

(a) providing a first elongated thermocouple element having a length dimension extending along a longitudinal axis and having a width dimension extending transverse to the longitudinal axis, the first thermocouple element formed from a first metallic thermocouple material and having a length substantially greater than its width and including a longitudinally extending external surface;

(b) covering said longitudinally extending surface with electrical insulation material;

(c) surrounding said insulation material with a second elongated thermocouple element having a length dimension extending along a longitudinal axis and having a width dimension extending transverse to the longitudinal axis, the second thermocouple element formed from a second metallic thermocouple material different from said first thermocouple material and having a length substantially greater than its width; and (d) forming a temperature sensing tip at one end of the probe by passing an abrasive member across the end to cause metallic particles from at least one of said first and second thermocouple elements to define an electrical connection between said elements.

18. A method in accordance with claim 17, including the step of compressing the second elongated thermocouple element along its length to tightly surround and engage the electrical insulating material.

19. A method in accordance with claim 18, wherein the compressing step is performed by swaging.

20. A method in accordance with claim 17, wherein the forming step provides a substantially planar end face.

21. A renewable thermocouple probe comprising, in combination, two coaxial metallic members of dissimilar metals capable of providing a thermocouple junction, one of the members surrounding the other and separated therefrom by an intervening insulation material to define a thermocouple probe, the probe having a planar sensing end, and a thermocouple junction formed at the sensing end between the metallic members by metallic particles of at least one of the two dissimilar metals extending across the insulation material at the sensing end to provide an electrical connection between the metallic members.

22. A renewable, elongated thermocouple probe comprising:

(a) a first thermocouple element formed from a first metallic thermocouple material and having a length greater than its width;

(b) a second thermocouple element formed from a second metallic thermocouple material different from said first material, said second thermocouple element having a length greater than its width and surrounding and spaced outwardly from said first thermocouple element;

(c) electrical insulation means positioned in the space between said first and second thermocouple elements to electrically insulate said thermocouple elements from each other;

(d) said thermocouple elements each having spaced first and second ends, each of said first ends electrically connected to a thermocouple reference junction, and each of said second ends and said insulation means having end faces that lie in an end surface and define a temperature sensing end of the thermocouple; and (e) connection means extending between each of said second ends and bridging said insulation means to define a sensing tip at said temperature sensing end, the temperature sensing end being abrasively erodable while maintaining continuous temperature sensing capability as the length of the probe diminishes.

23. A renewable, elongated thermocouple probe comprising:

(a) a first elongated thermocouple element formed from copper and having a length greater than its width;

(b) a second elongated thermocouple element formed from constantan and surrounding said first thermocouple element to define a thermocouple probe, said second thermocouple element having a length greater than its width;

(c) electrical insulating material positioned between opposed surfaces of said first and second thermocouple elements to electrically insulate said thermocouple elements from each other;

(d) said thermocouple elements each having first and second ends, each of said first ends electrically connected to a thermocouple reference junction, and each of said second ends and said insulation means having end faces that are flat and are substantially co-planar; and (e) connection means defined by metallic particles that provide a conduction path between said first and second thermocouple elements and over said insulation means at each of said second ends to define a temperature sensing tip, the tip being erodable while maintaining continuous temperature sensing capability as the length of the probe diminishes.

24. A method of making a renewable thermocouple probe, said method comprising:

(a) providing a first thermocouple element formed from a first metallic thermocouple material and having a length greater than its width and including a longitudinally extending external surface;
(b) covering said longitudinally extending surface with electrical insulation material;
(c) surrounding said insulation material with a second elongated thermocouple element formed from a second metallic thermocouple material different from said first material and having a length greater than its width, to define a thermocouple probe; and
(d) forming a temperature sensing tip at one end of the probe by passing an abrasive member across the end of the probe to cause abraded metallic particles from at least one of said first and second thermocouple elements to define an electrical connection across said insulation material and between said elements at said sensing tip.

* * * * *